(12) United States Patent
Huang et al.

(10) Patent No.: US 12,405,292 B2
(45) Date of Patent: Sep. 2, 2025

(54) VOLTAGE SAMPLER AND SOLID-STATE TRANSFORMER

(71) Applicant: Huawei Digital Power Technologies Co., Ltd., Shenzhen (CN)

(72) Inventors: Zhuyong Huang, Dongguan (CN); Xiaofei Zhang, Dongguan (CN); Peng Shuai, Shenzhen (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 624 days.

(21) Appl. No.: 17/850,459

(22) Filed: Jun. 27, 2022

(65) Prior Publication Data

US 2022/0413018 A1 Dec. 29, 2022

(30) Foreign Application Priority Data

Jun. 28, 2021 (CN) .......................... 202110719114.1

(51) Int. Cl.
*G01R 15/18* (2006.01)
*G01R 19/00* (2006.01)
(Continued)

(52) U.S. Cl.
CPC ......... *G01R 15/18* (2013.01); *G01R 19/0084* (2013.01); *H01B 5/02* (2013.01);
(Continued)

(58) Field of Classification Search
CPC .......... H05K 5/04; H05K 5/062; H05K 5/069; H05K 7/14; H05K 7/1427; H01B 17/005;
(Continued)

(56) References Cited

U.S. PATENT DOCUMENTS 6,515,437 B1 * 2/2003 Zinkler .................. H05B 39/00
315/312
7,414,507 B2 * 8/2008 Giandalia ............. H01F 27/345
336/200
(Continued)

FOREIGN PATENT DOCUMENTS

CN 101917126 A 12/2010
CN 207675822 U 7/2018
(Continued)

*Primary Examiner* — Tuan T Dinh
(74) *Attorney, Agent, or Firm* — Rimon PC

(57) ABSTRACT

This application provides a voltage sampler and a solid-state transformer. The voltage sampler includes a conductive housing, at least one sampling board located inside the housing, and a conducting layer. Each sampling board includes at least two resistors and a voltage input end. The resistors in the sampling board are electrically connected in sequence in the direction from a first end to a second end. The resistor at the first end is electrically connected to the voltage input end. The resistor at the second end is electrically connected to the housing, and the housing is electrically connected to a fixed potential end. The conducting layer is disposed between the at least one sampling board and the housing in the voltage sampler. The conducting layer is electrically connected to a resistor in the sampling board.

20 Claims, 10 Drawing Sheets

(51) Int. Cl.
    *H01B 5/02*         (2006.01)
    *H01B 17/00*       (2006.01)
    *H01B 17/62*       (2006.01)
    *H01C 1/16*         (2006.01)
    *H01F 27/42*       (2006.01)
    *H05K 7/14*         (2006.01)

(52) U.S. Cl.
    CPC ........... *H01B 17/005* (2013.01); *H01B 17/62* (2013.01); *H01C 1/16* (2013.01); *H01F 27/42* (2013.01); *H05K 7/1427* (2013.01)

(58) Field of Classification Search
    CPC ...... H01B 17/62; G01R 15/14; G01R 15/144; G01R 15/18; G01R 19/00; G01R 19/0084; H02M 1/007; H02M 1/32; H02M 1/36; H02M 5/14
    USPC .......... 361/782–784, 803, 816, 818; 336/199–200; 257/531
    See application file for complete search history.

(56) References Cited

U.S. PATENT DOCUMENTS

| | | | | |
|---|---|---|---|---|
| 8,044,759 | B2 * | 10/2011 | Yang | H01F 19/04 |
| | | | | 336/200 |
| 8,331,978 | B2 * | 12/2012 | Bhagat | H04B 1/0053 |
| | | | | 336/200 |
| 9,281,832 | B1 * | 3/2016 | Thiagarajan | H03M 1/127 |
| 9,357,602 | B1 * | 5/2016 | Chen | H05B 45/10 |
| 2017/0047734 | A1 * | 2/2017 | Jankowski | H01F 27/343 |
| 2021/0011072 | A1 | 1/2021 | Qu et al. | |
| 2021/0057986 | A1 * | 2/2021 | Lemmon | H02M 1/0009 |
| 2021/0081013 | A1 * | 3/2021 | Wang | G06F 1/20 |

FOREIGN PATENT DOCUMENTS

| | | |
|---|---|---|
| CN | 110018337 A | 7/2019 |
| CN | 111913027 A | 11/2020 |

\* cited by examiner

VOLTAGE SAMPLER AND SOLID-STATE TRANSFORMER

CROSS-REFERENCE TO RELATED APPLICATION

This application claims priority to Chinese Patent Application No. 202110719114.1 filed on Jun. 28, 2021, which is hereby incorporated by reference in its entirety.

TECHNICAL FIELD

This application relates to the field of power electronics technologies, and in particular, to a voltage sampler and a solid-state transformer.

BACKGROUND

With the development of power electronics technologies, the power electronics technologies have been gradually applied in the field of power systems in recent years, and solid-state transformer has become a hot research topic. A solid-state transformer (SST) is also referred to as an electronic power transformer (EPT), and is a static electrical device that combines a power electronics conversion technology and an electromagnetic induction principle-based high-frequency electric energy conversion technology to transform electric energy of one electric characteristic into electric energy of another electric characteristic. Solid-state transformer may be applied in the field of new-energy intelligent micro-grids, and may also be applied to the field of conventional power grids. In a conventional power grid, solid-state transformers may be configured to address the voltage disturbance problem in a power distribution network.

Compared with a conventional transformer, solid-state transformer has many advantages. An outstanding feature of an solid-state transformer lies in that a solid-state transformer can implement flexible control on the primary current, the secondary voltage, and the power in a circuit or network. Solid-state transformers can be applied to a power system to improve electric energy quality, improve power system stability, and implement flexible power transmission modes and real-time control on power flows in the power market.

However, the input voltage sampler inside a solid-state transformer is large and occupies a large space inside the solid state transformer.

SUMMARY

This application provides a voltage sampler and a solid-state transformer, to reduce the volume of an input voltage sampler of a solid-state transformer.

According to a first aspect, this application provides a voltage sampler, including a conductive housing, at least one sampling board located inside the housing, and a conducting layer. Each sampling board in the voltage sampler includes at least two resistors and a voltage input end. The resistors in the sampling board are electrically connected in sequence in a direction from a first end to a second end. The resistor at the first end is electrically connected to the voltage input end. The resistor at the second end is electrically connected to the housing, and the housing is electrically connected to a fixed potential end. A potential provided by the fixed potential end is a fixed value. The conducting layer is disposed between the at least one sampling board in the voltage sampler and the housing. The conducting layer is electrically connected to one of the at least two resistors in the sampling board, and a potential of the conducting layer is greater than that of the fixed potential end and less than that of the voltage input end.

Optionally, the sampling board may further include a printed circuit board. A signal wire configured to connect the voltage input end to the resistor and a signal wire configured to connect different resistors may be integrated in the printed circuit board, and then the resistors are mounted at corresponding locations on the printed circuit board. Certainly, the sampling board may be alternatively implemented in another manner. This is not limited herein.

In some embodiments of this application, the conducting layer is disposed between the sampling board and the housing, and the potential of the conducting layer is between the potential of the housing and the potential of the voltage input end. This can reduce a voltage difference between the sampling board and a surrounding conductor, and reduce a risk of damage to the sampling board due to excessive breakdown field strength, reduce a requirement on insulation between the sampling board and the surrounding conductor, and reduce the volume of the voltage sampler.

In a possible implementation, the voltage sampler may further include an insulator located inside the housing, at least one cavity configured to accommodate the sampling board is disposed in the insulator, and there is a gap between the sampling board and the insulator. In this way, solid insulation and air insulation are combined to insulate the sampling board, so that a good insulation effect can be achieved.

Optionally, one sampling board is disposed in each cavity in the insulator. When the voltage sampler includes at least two sampling boards, different sampling boards are located in different cavities of the insulator. In this way, solid insulation and air insulation may also be combined for insulation between different sampling boards, to further improve the insulation effect.

In a possible implementation, at least two cavities connected to each other are disposed in the insulator. In this way, more electrical components can be accommodated in the cavities in the insulator, to facilitate proper arrangement of locations of the electrical components in the voltage sampler.

Optionally, in the voltage sampler provided in some embodiments of this application, the conducting layer is disposed on an inner wall of the cavity, and an insulation film is disposed on a surface on a side that is of the conducting layer and that faces the sampling board. For example, the insulation film is insulation paper. The insulation film can be disposed on the surface of the conducting layer to further enhance an insulation effect between the conducting layer and the sampling board. During manufacturing, an inner surface of the insulator may be coated with the conducting layer, and then the surface of the conducting layer is coated with the insulation film.

In some other embodiments, the conducting layer may be embedded inside the insulator, so that the insulation effect between the conducting layer and the sampling board can also be enhanced.

In an actual application, to facilitate mounting of the sampling board into the cavity in the insulator, in some embodiments of this application, the insulator may include a first insulation portion and a second insulation portion fixedly connected to the first insulation portion. The first insulation portion may include a groove configured to accommodate the sampling board, and the groove in the first insulation portion and the second insulation portion form the cavity. During mounting of the sampling board, the sampling board may be first fixed in a corresponding groove in the first insulation portion, then the second insulation portion is aligned with and fixedly connected to the first insulation portion, and then a layer of conducting material is wrapped on an outer surface of the insulator to form the conductive housing on an outer side of the insulator. When the second insulation portion is disposed, a region that is of the second insulation portion and that corresponds to the groove in the first insulation portion may be formed as a flat surface. Certainly, a groove-shaped structure corresponding to the groove in the first insulation portion may be alternatively disposed in the second insulation portion, provided that the first insulation portion and the second insulation portion can be fixedly connected to form the cavity for accommodating the sampling board.

During disposing, the first insulation portion and the second insulation portion may be fixedly connected in a plurality of manners. For example, the following two manners may be used.

Manner 1:

A strip-shaped groove is disposed at the top of a side wall of the groove in the first insulation portion, a strip-shaped protrusion corresponding to a location of the strip-shaped groove is disposed in the second insulation portion, and the strip-shaped protrusion is embedded in the corresponding strip-shaped groove. In the manner 1, the strip-shaped groove is disposed in the first insulation portion, and the strip-shaped protrusion is disposed in the second insulation portion. In this way, the fixed connection between the first insulation portion and the second insulation portion can be made firmer. In addition, a creepage distance between two adjacent sampling boards can be increased. The creepage distance may be a shortest distance between two adjacent sampling boards along a surface of the insulator. In different application cases, the insulator around the sampling board may be electrically polarized, so that the insulator near the sampling board generates a charged region. In some embodiments of this application, the creepage distance between two adjacent sampling boards can be increased to ensure a good insulation effect between two adjacent sampling boards.

Manner 2:

A strip-shaped protrusion is disposed at the top of a side wall of the groove in the first insulation portion, a strip-shaped groove corresponding to a location of the strip-shaped protrusion is disposed in the second insulation portion, and the strip-shaped protrusion is embedded in the corresponding strip-shaped groove. In the manner 2, the strip-shaped protrusion is disposed in the first insulation portion, and the strip-shaped groove is disposed in the second insulation portion. In this way, the fixed connection between the first insulation portion and the second insulation portion can be made firmer. In addition, a creepage distance between two adjacent sampling boards can be increased to ensure a good insulation effect between two adjacent sampling boards.

Certainly, in addition to the manner 1 and the manner 2, in some embodiments, the first insulation portion and the second insulation portion may be alternatively fixedly connected in another manner. This is not limited herein.

In some embodiments of this application, the conducting layer may be disposed on an inner bottom surface and an inner side surface of the groove in the first insulation portion. In this way, the conducting layer may surround a corresponding sampling board, so that the conducting layer provides a good electric field shielding effect for the sampling board.

In a possible implementation, one conducting layer is disposed between the at least one sampling board and the housing in the voltage sampler, an orthographic projection of the conducting layer on the sampling board covers at least half of the resistors in the sampling board, and the orthographic projection of the conducting layer on the sampling board covers the resistor located at the first end, that is, the orthographic projection of the conducting layer on the sampling board covers a resistor with a higher voltage in the sampling board. In addition, the potential of the conducting layer is greater than ½ of the potential of the voltage input end. During disposing, a conductive connection wire may be disposed to electrically connect the conducting layer to a resistor whose voltage is greater than ½ of the potential of the voltage input end, so that the potential of the conducting layer is greater than ½ of the potential of the voltage input end.

Because the conducting layer can reduce a voltage difference between the resistor with a higher voltage in the sampling board and the surrounding conductor to reduce the requirement on insulation between the sampling board and the surrounding conductor, a distance between the resistor with a higher voltage in the sampling board and the surrounding conductor can be shortened. However, a voltage difference between the resistor with a lower voltage in the sampling board and the surrounding conductor is relatively small. Therefore, a distance between the resistor with a lower voltage in the sampling board and the surrounding conductor is relatively short, and it may not be an option for a conducting layer to be disposed near the resistor with a lower voltage in the sampling board.

Optionally, the orthographic projection of the conducting layer on the sampling board may cover 2n/3 resistors, and the potential of the conducting layer is equal to ⅔ of the potential of the voltage input end, where n is a quantity of resistors in the sampling board, and n is a multiple of 3. To be specific, a plurality of resistors connected in series in the sampling board are divided into three equal parts in sequence, the conducting layer is disposed at locations of 2n/3 resistors with higher voltages, and a resistor whose voltage is ⅔ of the potential of the voltage input end is electrically connected to the conducting layer. In this way, a voltage difference between the $1^{st}$ resistor and the conducting layer can be approximately equal to a voltage difference between the $(2n/3)^{th}$ resistor and the conducting layer, thereby reducing a requirement on insulation between each resistor and the surrounding conductor.

In another embodiment of this application, two conducting layers are disposed between the at least one sampling board and the housing in the voltage sampler: a first conducting layer and a second conducting layer. An orthographic projection of the first conducting layer on the sampling board covers some of the resistors in the sampling board, and an orthographic projection of the second conducting layer on the sampling board covers the other resistors in the sampling board. Optionally, the resistors covered by the first conducting layer 22a may be different from the resistors covered by the second conducting layer 22b, that is, a region covered by the first conducting layer 22a and a region covered by the second conducting layer 22b do not overlap. In an example implementation, the first conducting layer 22a and the second conducting layer 22b may cover all resistors in the sampling board, or a resistor with a lower voltage in the sampling board may not be covered by the conducting layers. In addition, the orthographic projection of the first conducting layer on the sampling board covers the resistor at the first end, and a potential of the first conducting layer is greater than that of the second conducting layer. To be specific, the orthographic projection of the first conducting layer on the sampling board covers a resistor with a higher voltage in the sampling board, and the orthographic projection of the second conducting layer on the sampling board covers a resistor with a lower voltage in the sampling board. In some embodiments of this application, the two conducting layers are disposed between the sampling board and the housing, so that a voltage difference between a resistor with a higher voltage in the sampling board and the surrounding conductor can be reduced, and a voltage difference between a resistor with a lower voltage in the sampling board and the surrounding conductor can also be reduced. Therefore, the distance between each resistor in the sampling board and the surrounding conductor can be made small, thereby reducing the volume of the voltage sampler.

Optionally, the orthographic projection of the first conducting layer on the sampling board may cover n/2 resistors in the sampling board, the potential of the first conducting layer is greater than ½ of the potential of the voltage input end, the orthographic projection of the second conducting layer on the sampling board covers the other n/2 resistors in the sampling board, and the potential of the second conducting layer is less than ½ of the potential of the voltage input end, where n is a quantity of resistors in the sampling board, and n is a multiple of 2. To be specific, a plurality of resistors connected in series in the sampling board are divided into two equal parts in sequence, the first conducting layer is disposed at locations of n/2 resistors with higher voltages, and the second conducting layer is disposed at locations of n/2 resistors with lower voltages.

In a possible implementation, a bent portion is disposed at an end that is of the first conducting layer and that is close to the second conducting layer, and the bent portion is bent toward the housing; and/or a bent portion is disposed at an end that is of the second conducting layer and that is close to the first conducting layer, and the bent portion is bent toward the housing. In this way, an electric field at a location between the first conducting layer and the second conducting layer can be dispersed, to prevent an electric field generated by the first conducting layer or the second conducting layer from affecting electrical performance of the sampling board.

According to a second aspect, an embodiment of this application further provides a solid-state transformer. The solid-state transformer may include a voltage sampler according to any one of the foregoing implementations and a power converter electrically connected to the voltage sampler. The solid-state transformer includes a voltage sampler according to any one of the foregoing implementations. Because the volume of the voltage sampler can be made small, the volume of the solid-state transformer can also be small.

REFERENCE NUMERALS

20: housing; 21a and 21b: sampling boards; 22: conducting layer; 22a: first conducting layer; 22b: second conducting layer; 23: insulator; 231: first insulation portion; 232: second insulation portion; 24: insulation film; 25: conductive connection wire; 30: sampling circuit; 31: operational amplifier; R1: first reference resistor; R2: second reference resistor; W1 and W2: cavities; U1: strip-shaped groove; U2: strip-shaped protrusion; and T1 and T2: bent portions.

DESCRIPTION OF EMBODIMENTS

Figure 1:
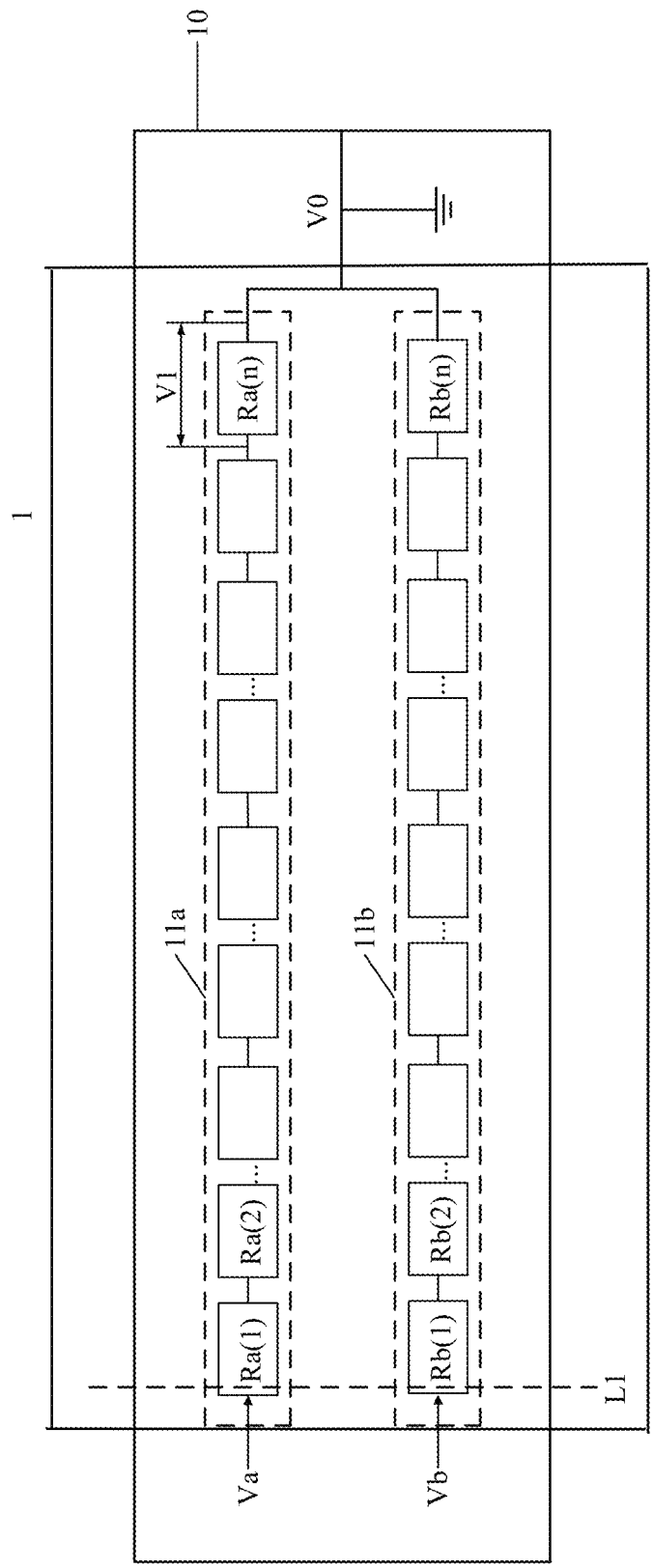
FIG. 1 is a schematic diagram of an overlooking structure of an input voltage sampler of a solid-state transformer in a related technology.

In a related technology, an input voltage of a solid-state transformer may be sampled through resistor sampling. FIG. 1 is a schematic diagram of an overlooking structure of an input voltage sampler which is included in a solid-state transformer 1 in the related technology. As shown in FIG. 1, the input voltage sampler may include a housing 10 and a sampling board located inside the housing 10. FIG. 1 shows an example in which the input voltage sampler includes two sampling boards: a sampling board 11a and a sampling board 11b. Each sampling board includes a plurality of resistors connected in series. For example, the sampling board 11a includes resistors Ra(1), Ra(2), ..., and Ra(n), and the sampling board 11b includes resistors Rb(1), Rb(2), ..., and Rb(n), where n is an integer greater than or equal to 2.

An input voltage Va of the solid-state transformer is applied to the resistor Ra(1), and an input voltage Vb is applied to the resistor Rb(1). The resistor Ra(n) and the resistor Rb(n) are electrically connected to the housing 10, and the resistor Ra(n) and the resistor Rb(n) are both electrically connected to a ground terminal, that is, terminal voltages V0 of the sampling board 11a and the sampling board 11b are both 0. Because each resistor in the sampling board can divide an input voltage, the input voltage gradually decays after passing through the resistors. The input voltage may be obtained through calculation by sampling a voltage of a resistor on a low-voltage side. For example, a voltage of the resistor Ra(n) may be sampled to obtain a voltage V1, and the input voltage Va is obtained through calculation by using the voltage V1 and a resistance value of each resistor. The resistor on the low-voltage side may be a limited quantity of resistors close to the ground terminal, for example, one, two, or three resistors close to the ground terminal, provided that the input voltage can be obtained by sampling the resistor on the low-voltage side.

Costs of sampling an input voltage through resistor sampling are low. However, basic insulation needs to be performed between the resistor and the housing, where the basic insulation can provide basic safety insulation for the resistor and the housing to protect the resistor and the housing against electric shocks, and insulation also needs to be performed between resistors in different sampling boards. Consequently, the distance between the resistor and the housing is long, and the distance between different sampling boards is also long, resulting in a large volume of the input voltage sampler.

Figure 2:
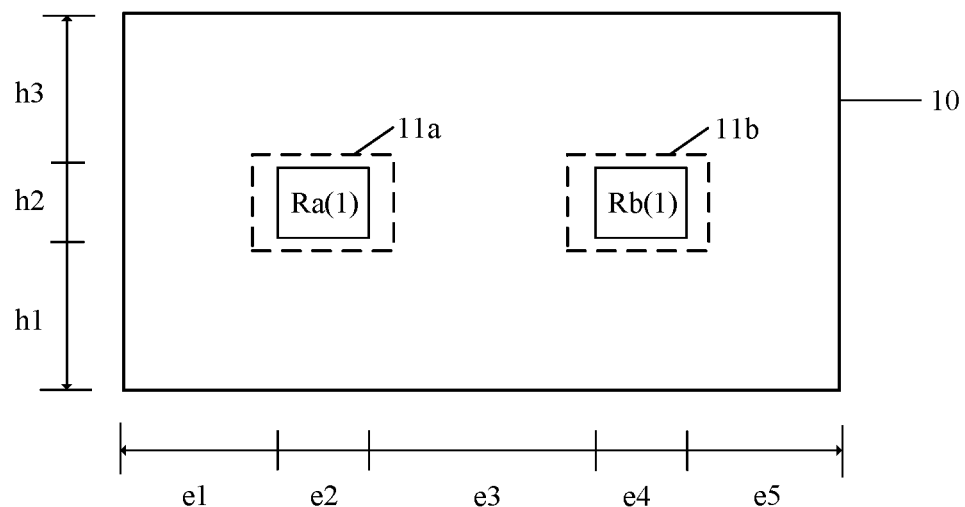
FIG. 2 is a schematic diagram of a structure of a cross section at a dashed line L1 in FIG. 1.

In a related technology, insulation may be attained for the input voltage sampler through air insulation or solid insulation. FIG. 2 is a schematic diagram of a structure of a cross section at a dashed line L1 in FIG. 1. As shown in FIG. 2, when insulation is performed for the input voltage sampler through air insulation, there is an air gap between the sampling board 11a (or 11b) and the housing 10, and there is an air gap between the sampling board 11a and the sampling board 11b. In FIG. 2, e1 is a distance between the sampling board 11a and a left side of the housing 10, e2 is a length of the sampling board 11a, e3 is a distance between the sampling board 11a and the sampling board 11b, e4 is a length of the sampling board 11b, e5 is a distance between the sampling board 11b and a right side of the housing 10, h1 is a distance between the sampling board 11a (or 11b) and a lower side of the housing 10, h2 is a width of the sampling board 11a (or 11b), and h3 is a distance between the sampling board 11a (or 11b) and an upper side of the housing 10. For example, the input voltage is approximately 10 kV. To meet an insulation requirement, h1, h3, e1, e3, and e5 need to be set to at least 90 mm. The volume of the input voltage sampler thus becomes large.

Figure 3:
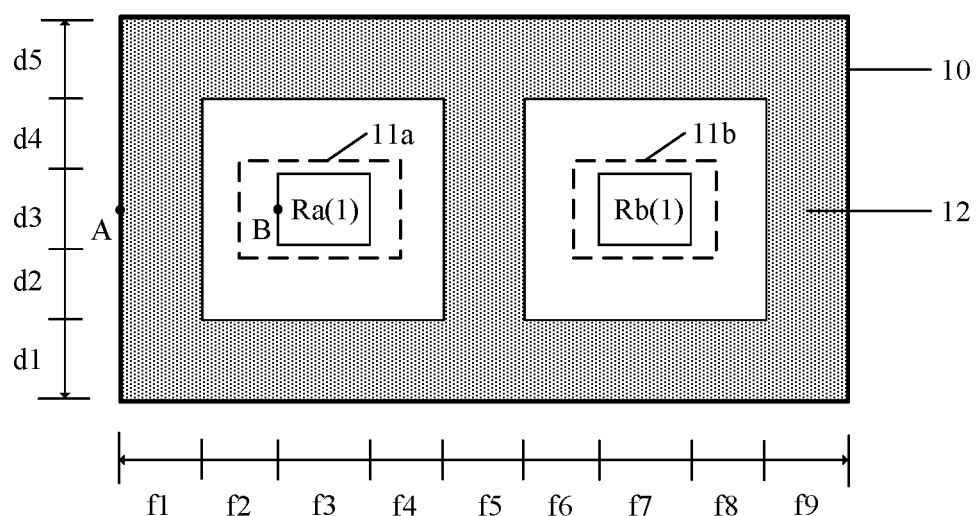
FIG. 3 is a schematic diagram of another structure of a cross section at a dashed line L1 in FIG. 1.

FIG. 3 is a schematic diagram of another structure of a cross section at a dashed line L1 in FIG. 1. As shown in FIG. 3, when insulation is attained for the input voltage sampler through solid insulation, a solid insulation layer 12 needs to be disposed in the housing 10. In considering the impact of an electric field on the resistors, to improve an insulation effect, there is an air gap between the sampling boards 11a and 11b and the solid insulation layer 12. In FIG. 3, d1, d5, f1, f5, and f9 indicate thicknesses of the solid insulation layer 12, d3 indicates a width of the sampling board 11a (or 11b), f3 indicates a length of the sampling board 11a, f7 indicates a length of the sampling board 11b, d2 and d4 indicate distances between the sampling board 11a (or 11b) and the solid insulation layer 12, f2 and f4 indicate distances between the sampling board 11a and the solid insulation layer 12, and f6 and f8 indicate distances between the sampling board 11b and the solid insulation layer 12.

For example, the input voltage is approximately 10 kV. To meet an insulation requirement, the thicknesses d1, d5, f1, f5, and f9 of the solid insulation layer 12 may be set to be within a range of 6 mm to 10 mm. Points A and B in FIG. 3 are used as examples. A voltage difference U_AB is 10 kV as an example, and an electric field formed by the points A and B is composed of air field strength E1 and solid material field strength E2. The air field strength E1 is field strength of an air gap between the points A and B, and the solid material field strength E2 is field strength of a solid insulation layer 12 between the points A and B. The air field strength E1 may be calculated based on the following formula:

$$E1 = \frac{U\_AB}{f2 + f1 * \varepsilon 1 / \varepsilon 2},$$

where
$\varepsilon 1$ indicates a dielectric constant of an air gap, f2 indicates a length of the air gap between the points A and B, $\varepsilon 2$ indicates a dielectric constant of a solid insulation layer 12, and f1 indicates a length of the solid insulation layer 12 between the points A and B.

During a voltage withstanding test, a voltage applied to the resistor Ra(1) needs to be greater than an operating voltage of U_AB. For example, a voltage of 35 kV may be applied to the resistor Ra(1) during the voltage withstand test. To ensure that the air field strength is less than air breakdown field strength, f2 needs to be set to at least 25 mm. Similarly, f4, f6, f8, d2, and d4 need also to be set to at least 25 mm. It can be learned that a volume of the input voltage sampler also becomes very large when insulation is performed for the input voltage sampler through solid insulation.

In view of this, to reduce the volume of an input voltage sampler of a solid-state transformer, the embodiments of this application provide an improved voltage sampler and solid-state transformer.

To make objectives, technical solutions, and advantages of this application clearer, the following further describes this application in detail with reference to the accompanying drawings.

It should be noted that, in this specification, similar reference numerals and letters in the following accompanying drawings represent similar items. Therefore, once an item is defined in an accompanying drawing, the item does not need to be further defined or interpreted in subsequent accompanying drawings.

In descriptions of this application, it should be noted that orientation or location relationships indicated by terms "center", "above", "below", "left", "right", "vertical", "horizontal", "inner", "outer", and the like are orientation or location relationships based on the accompanying drawings, and are merely intended for conveniently describing this application and simplifying descriptions, rather than indicating or implying that an apparatus or an element in question needs to have a specific orientation or needs to be constructed and operated in a specific orientation, and therefore cannot be construed as a limitation on this application. In addition, the terms "first" and "second" are merely used for a purpose of description, and cannot be understood as indicating or implying relative importance.

In descriptions of this application, it should be noted that unless otherwise expressly specified and limited, terms "mount", "interconnect", and "connect" should be understood in a broad sense. For example, the terms may indicate a fixed connection, a detachable connection, or an integral connection; may be a mechanical connection or an electrical connection; or may be direct interconnection, indirect interconnection through an intermediate medium, or communication between the interior of two elements. A person of ordinary skill in the art may understand specific meanings of the foregoing terms in this application based on a specific situation.

Embodiments of this application provide a voltage sampler and a solid-state transformer. The voltage sampler may sample an input voltage of the solid-state transformer. Certainly, the voltage sampler may also sample another voltage. This is not limited herein. The solid-state transformer may be applied in the field of new-energy intelligent micro-grids, and may also be applied to the field of conventional power grids. The solid-state transformer may serve as an intermediate device between a power grid and a load device, and is configured to convert a voltage in the power grid for use by the load device. In a conventional power grid, the solid-state transformer may be configured to resolve a voltage disturbance problem in a power distribution network.

Figure 4:
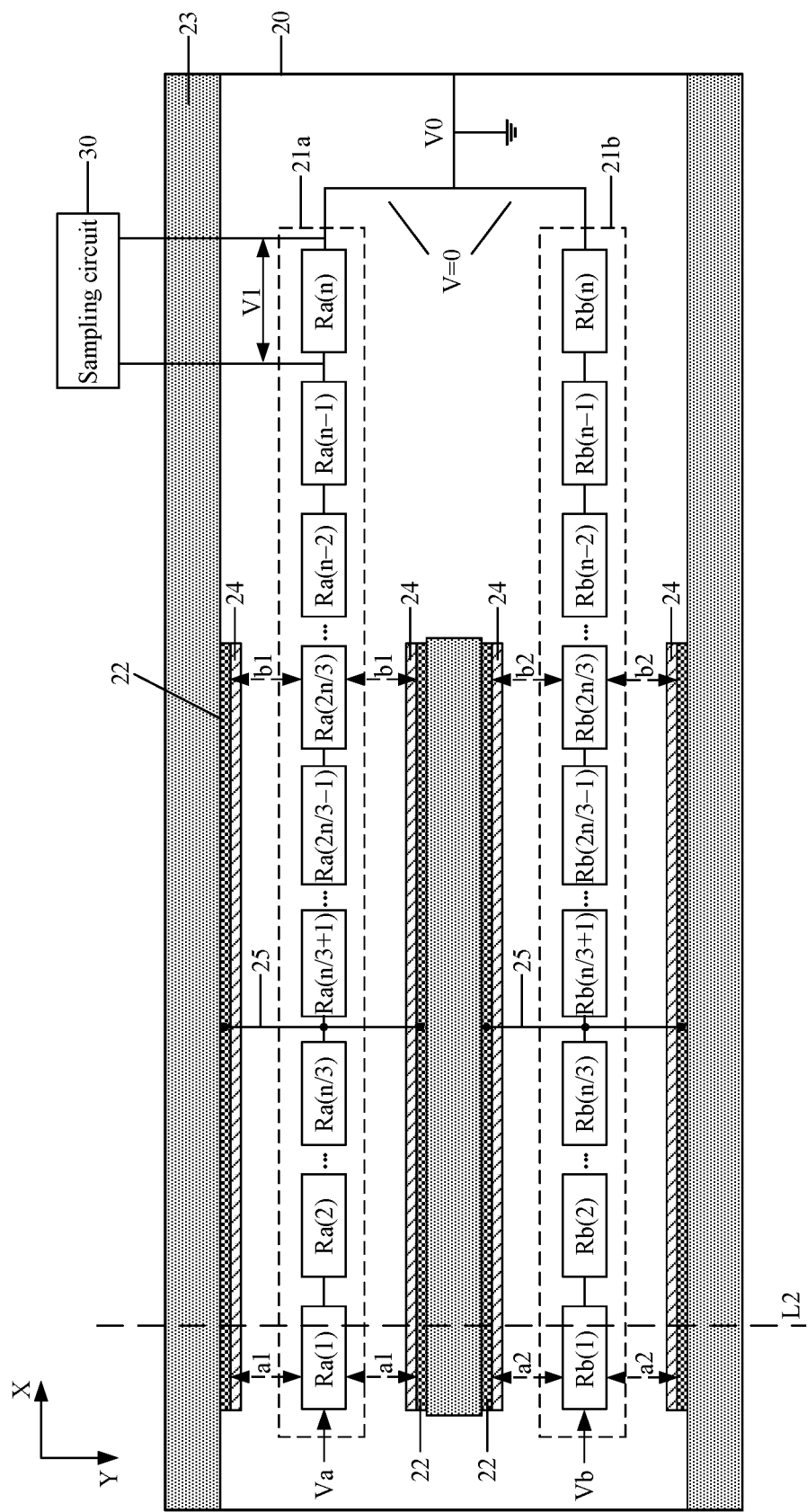
FIG. 4 is a schematic diagram of an overlooking structure of a voltage sampler according to an embodiment of this application.

FIG. 4 is a schematic diagram of an example structure of a voltage sampler according to an embodiment of this application. FIG. 4 may be a view of a plane on which X and Y in a coordinate system are located. As shown in FIG. 4, the voltage sampler may include a conductive housing 20 and at least one sampling board (for example, 21a or 21b in the figure) located inside the housing 20. Each sampling board in the voltage sampler may include at least two resistors and a voltage input end. For example, in FIG. 4, the sampling board 21a includes resistors Ra(1), Ra(2), ..., and Ra(n), and the sampling board 21b includes resistors Rb(1), Rb(2), ..., and Rb(n), where n is an integer greater than or equal to 2. The resistors in the sampling board are electrically connected in sequence in a direction from a first end (for example, a left end in FIG. 4) to a second end (for example, a right end in FIG. 4). The resistors Ra(1), Ra(2), ..., and Ra(n) in the sampling board 21a are electrically connected in sequence from the left end to the right end. The resistors Rb(1), Rb(2), ..., and Rb(n) in the sampling board 21b are electrically connected in sequence from the left end to the right end. In addition, a resistor at the first end is electrically connected to the voltage input end. For example, in FIG. 4, the resistor Ra(1) in the sampling board 21a is electrically connected to the voltage input end, that is, an input voltage Va is applied to the resistor Ra(1); and the resistor Rb(1) in the sampling board 21b is electrically connected to the voltage input end, that is, an input voltage Vb is applied to the resistor Rb(1). A resistor at the second end is electrically connected to the housing 20, and the housing 20 is electrically connected to a fixed potential end. A potential provided by the fixed potential end is a fixed value. The fixed potential is usually less than an input voltage of a solid-state transformer. For example, the fixed potential may be a zero potential. To be specific, the resistor Ra(n) and the resistor Rb(n) may be grounded. In this case, a terminal voltage V0 of each sampling board is 0. The housing is electrically connected to the fixed potential end. This can prevent damage to other electrical components when an exception, for example, an electric leakage occurs in the voltage sampler, and can also prevent an electric shock on an operator. Optionally, the housing is made of a conducting material, or the housing is made of an insulating material. In addition, a surface of the housing is coated with a conductive film, so that the housing can conduct electricity.

Optionally, the sampling board may further include a printed circuit board. A signal wire configured to connect the voltage input end to the resistor and a signal wire configured to connect different resistors may be integrated in the printed circuit board, and then the resistors are mounted at corresponding locations on the printed circuit board. Certainly, the sampling board may be alternatively implemented in another manner. This is not limited herein.

An exemplary embodiment of this application is described by using an example in which the voltage sampler includes two sampling boards. In an actual application, the quantity of sampling boards in the voltage sampler may be different. For example, the voltage sampler may alternatively include three sampling boards. This may be set according to an actual requirement of an actual power grid. The quantity of sampling boards in the voltage sampler is not limited herein.

While in use, because each resistor in the sampling board can divide an input voltage, the input voltage gradually decays after passing through each resistor. The input voltage may be obtained through calculation by sampling a voltage of a resistor on a low-voltage side. For example, a voltage of the resistor Ra(n) may be sampled to obtain a voltage V1, and the input voltage Va is obtained through calculation by using the voltage V1 and a resistance value of each resistor. Optionally, the input voltage Va may be obtained through calculation by using an expression: V1=Va×Ra(n)/(Ra(1)+ . . . +Ra(n)). The resistor on the low-voltage side may be a limited quantity of resistors close to the ground terminal, for example, one, two, or three resistors close to the ground terminal, provided that the input voltage can be obtained by sampling the resistor on the low-voltage side.

Figure 5:
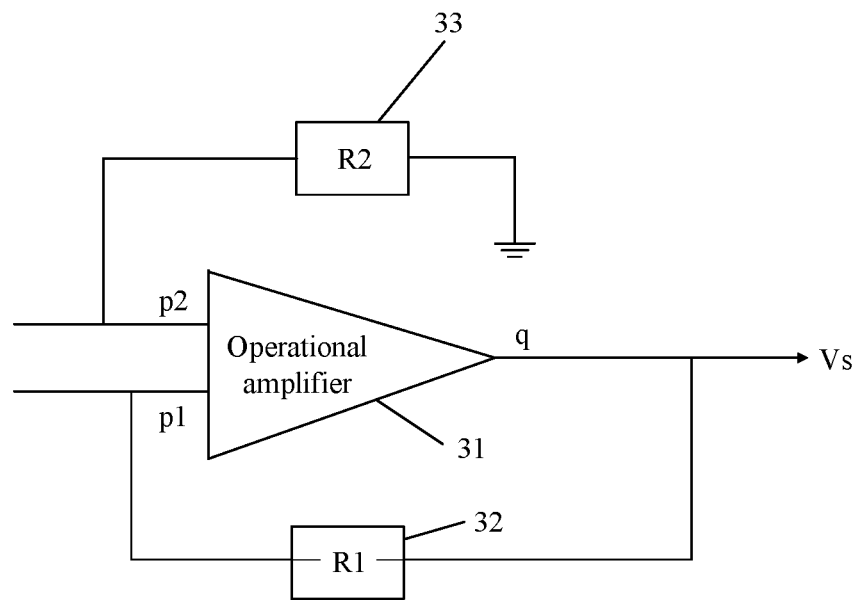
FIG. 5 is a schematic diagram of a structure of a sampling circuit.

In an example implementation, a sampling circuit 30 may be used to sample the voltage of the resistor on the low-voltage side. FIG. 5 is a schematic diagram of a structure of a sampling circuit. With reference to FIG. 4 and FIG. 5, the sampling circuit 30 may include an operational amplifier 31, a first reference resistor R1, and a second reference resistor R2. A first input end p1 of the operational amplifier 31 is electrically connected to the first reference resistor R1. A second input end p2 is electrically connected to the second reference resistor R2. The first input end p1 and the second input end p2 of the operational amplifier 31 are electrically connected to the resistor on the low-voltage side. An output end q may output a sampled voltage Vs. Sampling on the voltage V1 of the resistor Ra(n) is used as an example. The first input end p1 and the second input end p2 of the operational amplifier 31 are respectively electrically connected to two ends of the resistor Ra(n), and the voltage V1 of the resistor Ra(n) may be determined based on the sampled voltage Vs obtained through sampling. Certainly, the voltage of the resistor on the low-voltage side may be alternatively sampled in another manner. This is not limited herein.

Figure 6A:
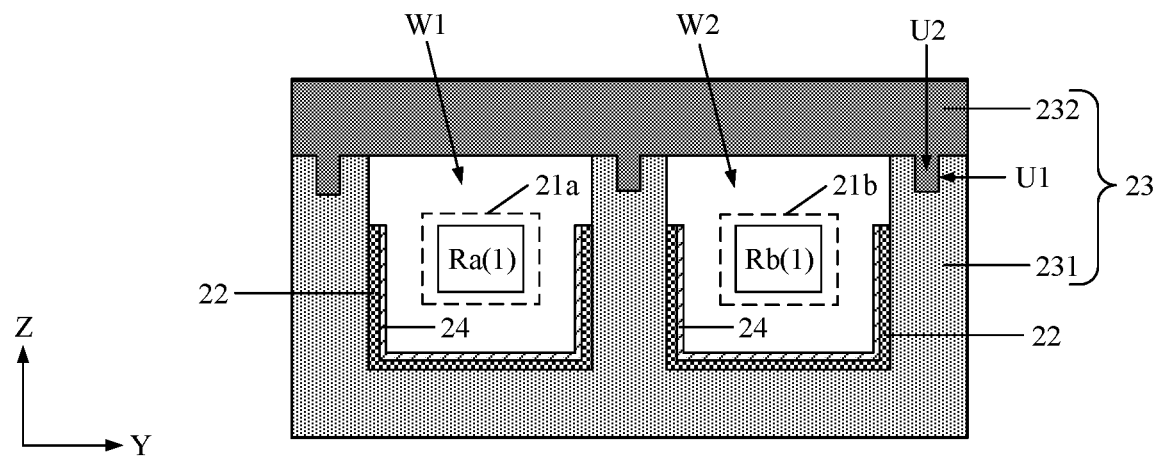
FIG. 6a is a schematic diagram of a cross section at a dashed line L2 in FIG. 4.

FIG. 6a is a schematic diagram of a cross section at a dashed line L2 in FIG. 4. FIG. 6a may be a view of a plane on which Y and Z in the coordinate system are located. As shown in FIG. 4 and FIG. 6a, the voltage sampler provided in some embodiments of this application may further include a conducting layer 22. The conducting layer 22 is disposed between the at least one sampling board and the housing 20. The conducting layer 22 is electrically connected to a resistor in the sampling board, and a potential of the conducting layer 22 is greater than that of the fixed potential end and less than that of the voltage input end. In some embodiments of this application, the conducting layer 22 is disposed between the sampling board and the housing 20, and the potential of the conducting layer 22 is between the potential of the housing 20 and the potential of the voltage input end. This can reduce a voltage difference between the sampling board and a surrounding conductor, reduce a risk of damage to the sampling board due to excessive breakdown field strength, reduce a requirement on insulation between the sampling board and the surrounding conductor, and reduce a volume of the voltage sampler.

Figure 7A:
FIG. 7a is a schematic diagram of an overlooking structure of a voltage sampler whose components such as a sampling board are omitted.

FIG. 7a is a schematic diagram of an overlooking structure of the voltage sampler whose components such as a sampling board are omitted. With reference to FIG. 6a and FIG. 7a, in some embodiments of this application, the voltage sampler may further include an insulator 23 located inside the housing 20. At least one cavity configured to accommodate the sampling board is disposed in the insulator 23, and there is a gap between the sampling board and the insulator 23. For example, the insulator 23 may include a cavity W1, and the sampling board 21a may be disposed in the cavity W1. In this way, solid insulation and air insulation are combined to insulate the sampling board 21a, so that an insulation effect can be good.

Optionally, one sampling board may be disposed in each cavity. When the voltage sampler includes at least two sampling boards, for example, the sampling boards 21a and 21b, different sampling boards may be disposed in different cavities of the insulator 23. For example, the insulator 23 may include cavities W1 and W2, the sampling board 21a may be disposed in the cavity W1, and the sampling board 21b may be disposed in the cavity W2. In this way, insulation may be attained between different sampling boards by using the insulator 23 and an air gap. That is, solid insulation and air insulation may also be combined for insulation between different sampling boards, to further improve the insulation effect.

As shown in FIG. 7a, in the voltage sampler, at least two cavities connected to each other are disposed in the insulator 23. For example, the cavity W1 and the cavity W2 in the insulator 23 are connected to each other. In this way, more electrical components can be accommodated in the cavities in the insulator 23, to facilitate proper arrangement of locations of the electrical components in the voltage sampler.

In an actual application, to facilitate mounting of the sampling board into the cavity in the insulator, as shown in FIG. 6a, in some embodiments of this application, the insulator 23 may include a first insulation portion 231 and a second insulation portion 232 fixedly connected to the first insulation portion 231. The first insulation portion 231 may include a groove configured to accommodate the sampling board, and the groove in the first insulation portion 231 and the second insulation portion 232 form the cavity. During mounting of the sampling board, the sampling board may be first fixed in a corresponding groove in the first insulation portion 231, then the second insulation portion 232 is aligned with and fixedly connected to the first insulation portion 231, and then a layer of conducting material is wrapped on an outer surface of the insulator 23 to form the conductive housing 20 on an outer side of the insulator 23. When the second insulation portion 232 is installed, a region that is of the second insulation portion 232 and that corresponds to the groove in the first insulation portion 231 may be formed as a flat surface. Certainly, a groove-shaped structure corresponding to the groove in the first insulation portion 231 may be alternatively disposed in the second insulation portion 232, provided that the first insulation portion 231 and the second insulation portion 232 can be fixedly connected to form the cavity for accommodating the sampling board.

During disposing, the first insulation portion and the second insulation portion may be fixedly connected in a plurality of manners. For example, the following two manners may be used.

Manner 1:

As shown in FIG. 6a, a strip-shaped groove U1 is disposed at the top of a side wall of the groove in the first insulation portion 231, the strip-shaped groove U1 extends in a direction perpendicular to the plane shown in FIG. 6a, a strip-shaped protrusion U2 corresponding to a location of the strip-shaped groove U1 is disposed in the second insulation portion 232, and the strip-shaped protrusion U2 is embedded in the corresponding strip-shaped groove U1. In the manner 1, the strip-shaped groove U1 is disposed in the first insulation portion 231, and the strip-shaped protrusion U2 is disposed in the second insulation portion 232. In this way, the fixed connection between the first insulation portion 231 and the second insulation portion 232 can be made firmer. In addition, a creepage distance between two adjacent sampling boards can be increased. The creepage distance may be the shortest distance between two adjacent sampling boards along a surface of the insulator 23. In different application cases, the insulator around the sampling board may be electrically polarized, so that the insulator near the sampling board generates a charged region. In some embodiments of this application, the creepage distance between two adjacent sampling boards can be increased to ensure good insulation between two adjacent sampling boards.

Figure 6B:
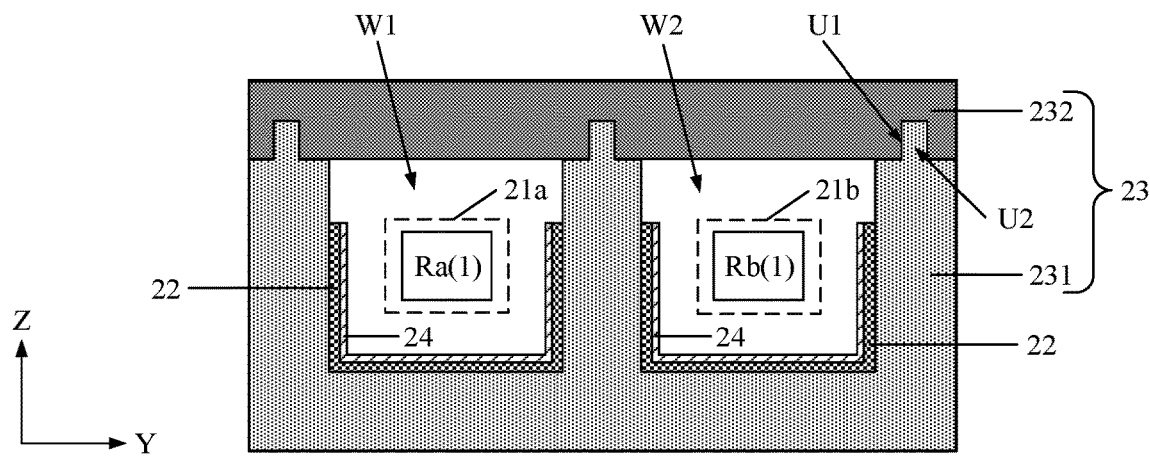
FIG. 6b is schematic diagram of another cross section at a dashed line L2 in FIG. 4.

Manner 2:

FIG. 6b is schematic diagram of another cross section at a dashed line L2 in FIG. 4. FIG. 6b may be a view of a plane on which Y and Z in the coordinate system are located. As shown in FIG. 6b, a strip-shaped protrusion U2 is disposed at the top of a side wall of the groove in the first insulation portion 231, a strip-shaped groove U1 corresponding to a location of the strip-shaped protrusion U2 is disposed in the second insulation portion 232, and the strip-shaped protrusion U2 is embedded in the corresponding strip-shaped groove U1. In the manner 2, the strip-shaped protrusion U2 is disposed in the first insulation portion 231, and the strip-shaped groove U1 is disposed in the second insulation portion 232. In this way, the fixed connection between the first insulation portion 231 and the second insulation portion 232 can be made firmer. In addition, a creepage distance between two adjacent sampling boards can be increased to achieve a good insulation effect between two adjacent sampling boards.

Certainly, in addition to the manner 1 and the manner 2, in some embodiments, the first insulation portion and the second insulation portion may be alternatively fixedly connected in another manner. This is not limited herein.

In some embodiments of this application, as shown in FIG. 6a, the conducting layer 22 may be disposed on an inner bottom surface and an inner side surface of the groove in the first insulation portion 231, that is, a shape of the conducting layer 22 may be a groove shape. In this way, the conducting layer 22 may surround a corresponding sampling board, so that the conducting layer 22 provides a good effect for the sampling board. In an example implementation, a location and a shape of the conducting layer 22 may be set according to an actual requirement. For example, the conducting layer may be disposed in a region that is of the second insulation portion 232 and that corresponds to the groove in the first insulation portion 231, or the conducting layer may be disposed only on one side of the sampling board. A specific manner of providing the conducting layer is not limited herein.

Optionally, in the voltage sampler provided in some embodiments of this application, as shown in FIG. 4 and FIG. 6a, the conducting layer 22 is disposed on an inner wall of the cavity, and an insulation film 24 is disposed on a surface on a side that is of the conducting layer 22 and that faces the sampling board. For example, the insulation film 24 is insulation paper. The insulation film 24 can be disposed on the surface of the conducting layer 22 to further enhance an insulation effect between the conducting layer 22 and the sampling board. During manufacturing, an inner surface of the insulator 23 may be coated with the conducting layer 22, and then the surface of the conducting layer 22 is coated with the insulation film 24.

Figure 8:
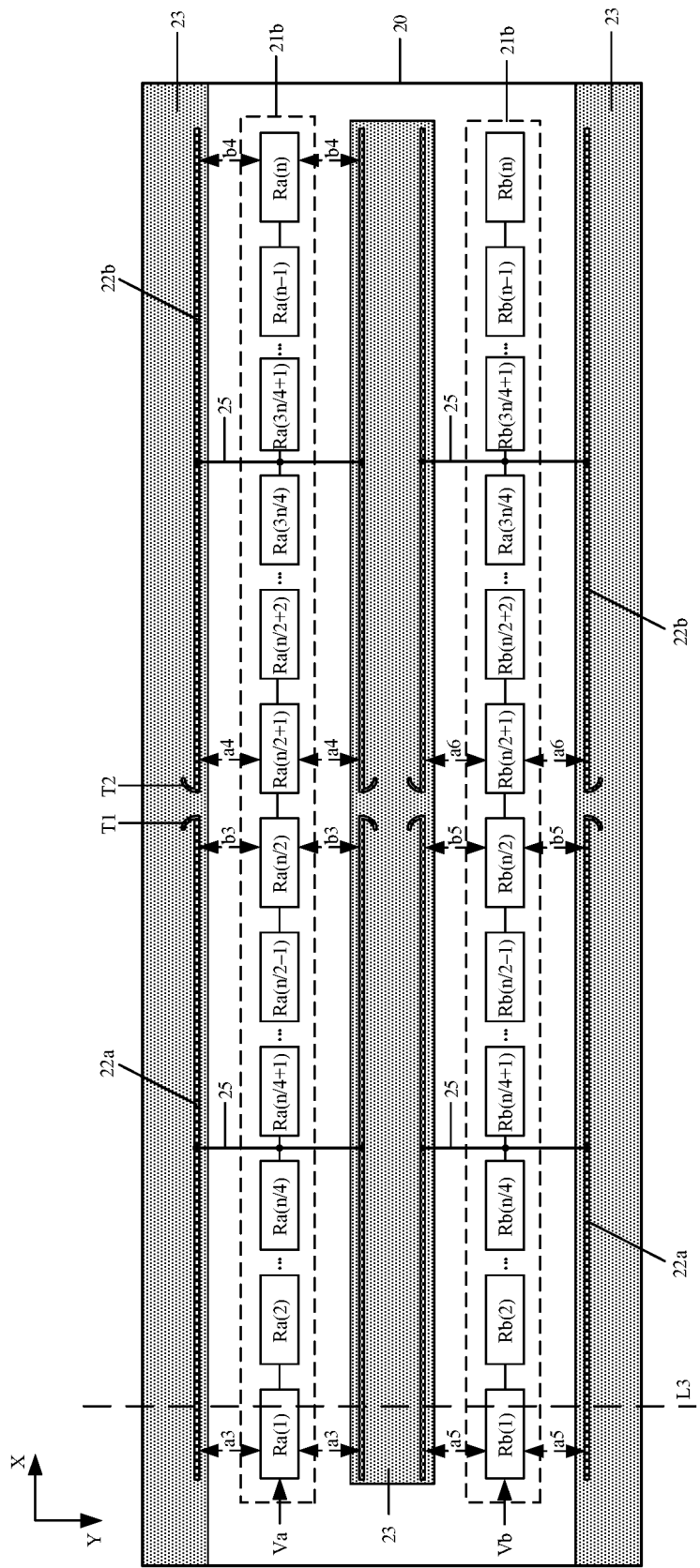
FIG. 8 is a schematic diagram of another overlooking structure of a voltage sampler according to an embodiment of this application.
Figure 9:
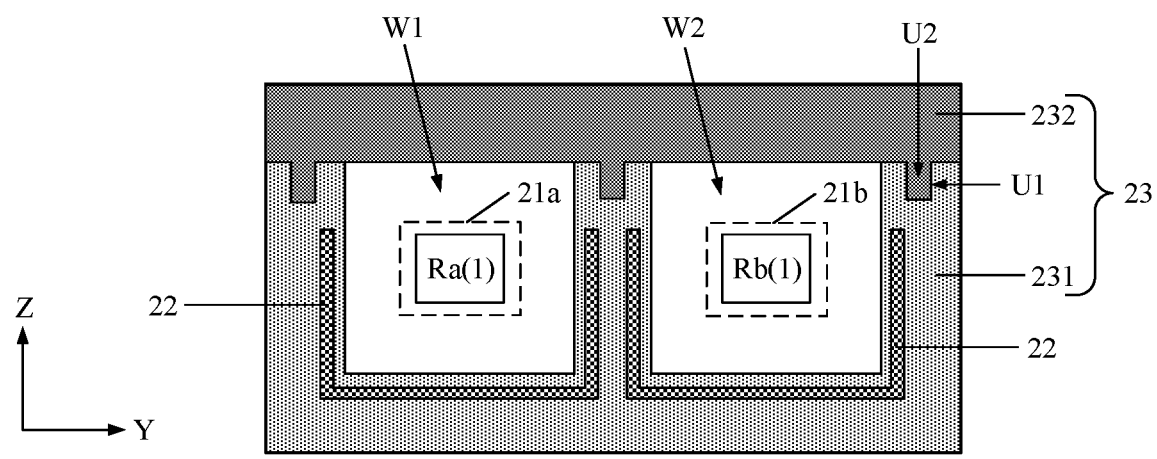
FIG. 9 is a schematic diagram of a cross section at a dashed line L3 in FIG. 8.

FIG. 8 is a schematic diagram of another overlooking structure of the voltage sampler according to an embodiment of this application. FIG. 9 is a schematic diagram of a cross section at a dashed line L3 in FIG. 8. FIG. 8 may be a view of a plane on which X and Y in the coordinate system are located. FIG. 9 may be a view of a plane on which Y and Z in the coordinate system are located. As shown in FIG. 8 and FIG. 9, in some other embodiments, the conducting layer 22 may be embedded inside the insulator 23, so that the insulation effect between the conducting layer 22 and the sampling board can also be enhanced.

Figure 7B:
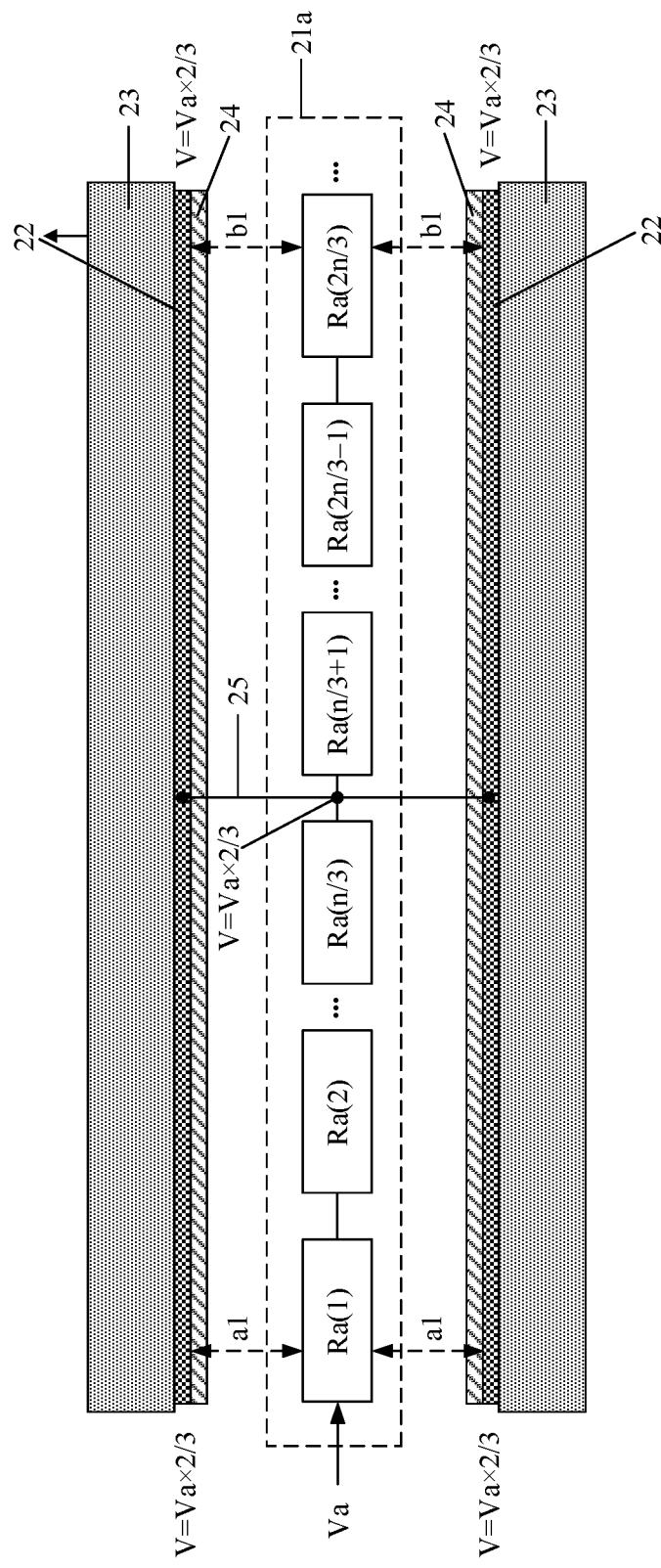
FIG. 7b is a locally enlarged schematic diagram of a sampling board in FIG. 4.

In an example implementation, in the voltage sampler provided in some embodiments of this application, as shown in FIG. 4 and FIG. 6a, a conducting layer 22 is disposed between the at least one sampling board and the housing 20 in the voltage sampler. For example, a conducting layer 22 may be disposed between the sampling board 21a and the housing 20, and a conducting layer 22 may be disposed between the sampling board 21b and the housing 20. FIG. 7b is a locally enlarged schematic diagram of a sampling board in FIG. 4. With reference to FIG. 4 and FIG. 7b, an orthographic projection of the conducting layer 22 on the sampling board covers at least half of resistors in the sampling board, and the orthographic projection of the conducting layer 22 on the sampling board covers the resistor located at the first end, that is, the orthographic projection of the conducting layer 22 on the sampling board covers a resistor with a higher voltage in the sampling board. For example, an orthographic projection of the conducting layer 22 on the sampling board 21a covers the resistors Ra(1) to Ra(n/2), and an orthographic projection of the conducting layer 22 on the sampling board 21b covers the resistors Ra(1) to Ra(n/2). In addition, the potential of the conducting layer 22 is greater than ½ of the potential of the voltage input end. During disposing, a conductive connection wire 25 may be disposed to electrically connect the conducting layer 22 to a resistor whose voltage is greater than ½ of the potential of the voltage input end, so that the potential of the conducting layer 22 is greater than ½ of the potential of the voltage input end.

Because the conducting layer 22 can reduce a voltage difference between the resistor with a higher voltage in the sampling board and the surrounding conductor to reduce the requirement on insulation between the sampling board and the surrounding conductor, the distance between the resistor with a higher voltage in the sampling board and the surrounding conductor can be shortened. However, a voltage difference between a resistor with a lower voltage in the sampling board and the surrounding conductor is already small. Therefore, the distance between the resistor with a lower voltage in the sampling board and the surrounding conductor is already short, and a conducting layer may alternatively not be needed near the resistor with a lower voltage in the sampling board. Therefore, the volume of the voltage sampler shown in FIG. 4 in this application can be kept small or made smaller.

Optionally, still with reference to FIG. 4 and FIG. 7b, the orthographic projection of the conducting layer 22 on the sampling board may cover 2n/3 resistors, and the potential of the conducting layer is equal to ⅔ of the potential of the voltage input end, where n is a quantity of resistors in the sampling board, and n is a multiple of 3. To be specific, a plurality of resistors connected in series in the sampling board are divided into three equal parts in sequence, the conducting layer 22 is disposed at locations of 2n/3 resistors with higher voltages, and a resistor whose voltage is ⅔ of the potential of the voltage input end is electrically connected to the conducting layer 22. In this way, a voltage difference between the $1^{st}$ resistor and the conducting layer 22 can be approximately equal to a voltage difference between the $(2n/3)^{th}$ resistor and the conducting layer 22, thereby reducing a requirement on insulation between each resistor and the surrounding conductor.

For example, a conducting layer 22 is disposed at locations of the resistors Ra(1) to Ra(2n/3) in the sampling board 21a, and a voltage at a location between the resistor Ra(n/3) and the resistor Ra(n/3+1) is led out to the conducting layer 22. In this case, a voltage difference between the resistor Ra(1) and the conducting layer 22 is Va×⅓, and a voltage difference between the resistor Ra(2n/3) and the conducting layer 22 is also Va×⅓. In this way, a distance a1 between the resistor Ra(1) and the conducting layer 22 may be equal to a distance b1 between the resistor Ra(2n/3) and the conducting layer 22. In addition, because a voltage difference between the conducting layer 22 and each resistor between the resistor Ra(1) and the resistor Ra(2n/3) is less than Va×⅓, distances between these resistors and the conducting layer 22 are also set to a1 (or b1). This can also meet a requirement on insulation between these resistors and the conducting layer 22.

Similarly, a conducting layer 22 may be disposed at locations of the resistors Rb(1) to Rb(2n/3) in the sampling board 21b, and a voltage at a location between the resistor Rb(n/3) and the resistor Rb(n/3+1) can be led out to the conducting layer 22. A voltage difference between the resistor Rb(1) and the conducting layer 22 is Vb×⅓, and a voltage difference between the resistor Rb(2n/3) and the conducting layer 22 is also Vb×⅓. In this way, a distance a2 between the resistor Rb(1) and the conducting layer 22 may be equal to a distance b2 between the resistor Rb(2n/3) and the conducting layer 22. In addition, because a voltage difference between the conducting layer 22 and each resistor between the resistor Rb(1) and the resistor Rb(2n/3) is less than Vb×⅓, the distances between these resistors and the conducting layer 22 are also set to a2 (or b2). This can also meet a requirement on insulation between these resistors and the conducting layer 22.

For example, the input voltage is approximately 10 kV, that is, Va=10 kV, and Vb=10 kV. The voltage difference between the resistor Ra(n/3) and the conducting layer 22 is 0. Because a voltage of the resistor Ra(n/3) is approximately 6.67 kV, a potential of the conducting layer 22 at a location of the resistor Ra(n/3) is also approximately 6.67 kV. The voltage difference between the resistor Ra(1) and the conducting layer 22 is approximately 3.34 kV. Through calculation, the distance a1 between the resistor Ra(1) and the conducting layer 22 may be set to approximately 8.5 mm. Because a voltage of the resistor Ra(2n/3) is approximately 3.34 kV, the voltage difference between the resistor Ra(2n/3) and the conducting layer 22 is approximately −3.34 kV. Through calculation, the distance b1 between the resistor Ra(2n/3) and the conducting layer 22 may be set to approximately 8.5 mm. Similarly, the distance a2 between the resistor Rb(1) and the conducting layer 22 may also be set to approximately 8.5 mm, and the distance b2 between the resistor Rb(2n/3) and the conducting layer 22 may also be set to approximately 8.5 mm. Compared with a related technology in which a distance between a sampling board and a solid insulation layer needs to be set to approximately 25 mm, a volume of a voltage sampler can be greatly reduced in some embodiments of this application.

Figure 10A:
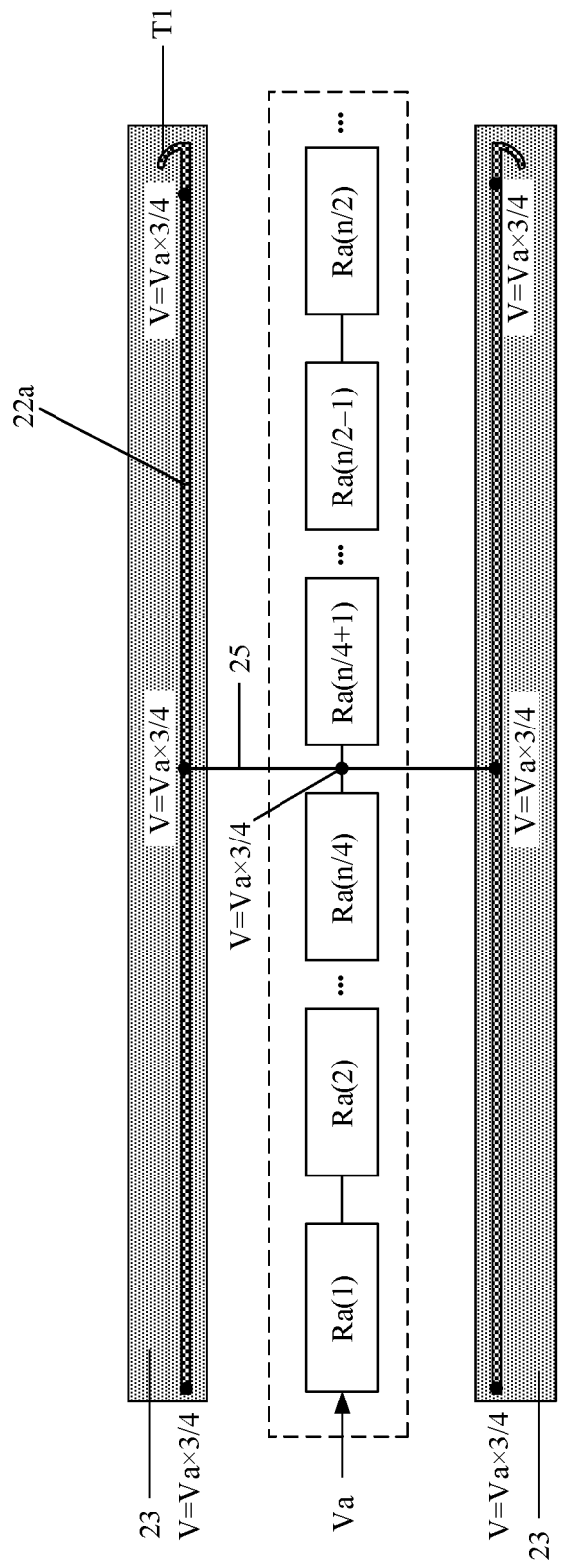
FIG. 10a is a locally enlarged schematic diagram of a first conducting layer in FIG. 8.
Figure 10B:
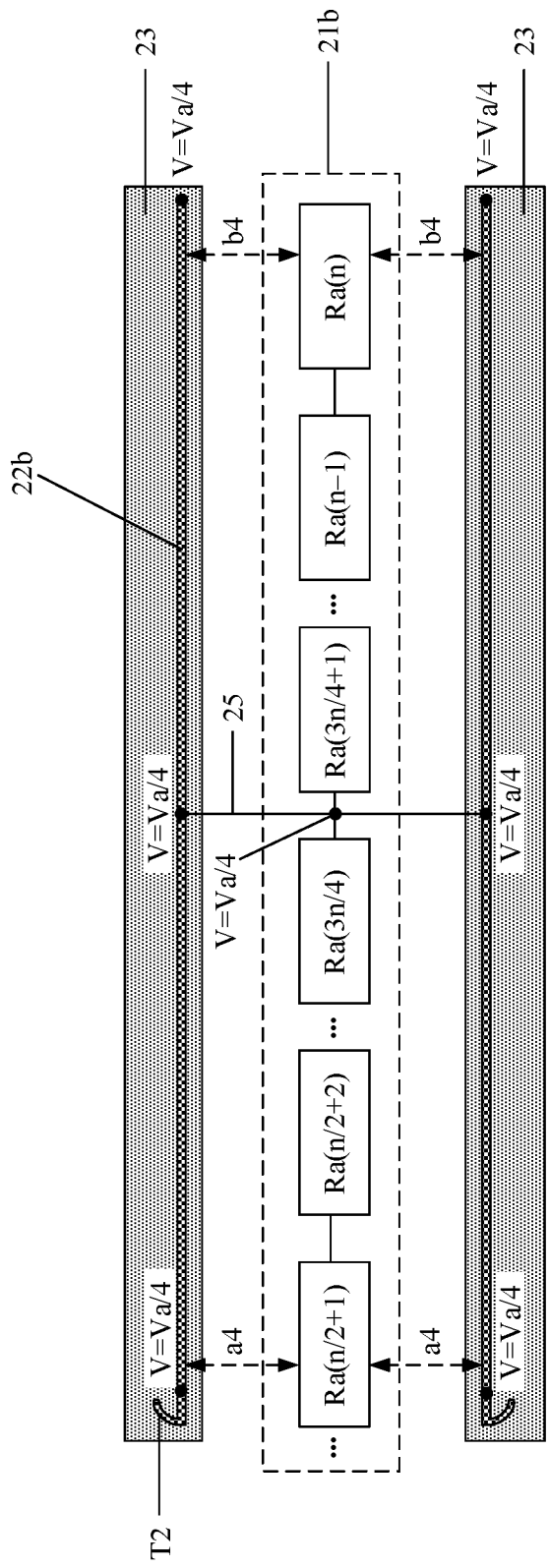
FIG. 10b is a locally enlarged schematic diagram of a second conducting layer in FIG. 8.

In another embodiment of this application, as shown in FIG. 8, two conducting layers may be disposed between the at least one sampling board and the housing 20 in the voltage sampler: a first conducting layer 22a and a second conducting layer 22b. FIG. 10a is a locally enlarged schematic diagram of the first conducting layer in FIG. 8. FIG. 10b is a locally enlarged schematic diagram of the second conducting layer in FIG. 8. With reference to FIG. 8, FIG. 10a, and FIG. 10b, an orthographic projection of the first conducting layer 22a on the sampling board covers some of the resistors in the sampling board, and an orthographic projection of the second conducting layer 22b on the sampling board covers the other resistors in the sampling board. Optionally, the resistors covered by the first conducting layer 22a may be different from the resistors covered by the second conducting layer 22b, that is, a region covered by the first conducting layer 22a and a region covered by the second conducting layer 22b do not overlap. In an example implementation, the first conducting layer 22a and the second conducting layer 22b may cover all resistors in the sampling board. Alternatively, a resistor with a lower voltage in the sampling board is left uncovered by the conducting layers. In addition, the orthographic projection of the first conducting layer 22a on the sampling board covers the resistor at the first end, and a potential of the first conducting layer 22a is greater than that of the second conducting layer 22b. To be specific, the orthographic projection of the first conducting layer 22a on the sampling board covers a resistor with a higher voltage in the sampling board, and the orthographic projection of the second conducting layer 22b on the sampling board covers a resistor with a lower voltage in the sampling board. In some embodiments of this application, the two conducting layers are disposed between the sampling board and the housing 20, so that a voltage difference between a resistor with a higher voltage in the sampling board and the surrounding conductor can be reduced, and a voltage difference between a resistor with a lower voltage in the sampling board and the surrounding conductor can also be reduced. Therefore, the distance between each resistor in the sampling board and the surrounding conductor can be shortened, thereby reducing the volume of the voltage sampler.

Optionally, still with reference to FIG. 8, FIG. 10a, and FIG. 10b, the orthographic projection of the first conducting layer 22a on the sampling board may cover n/2 resistors in the sampling board, and the potential of the first conducting layer 22a is greater than ½ of the potential of the voltage input end. The orthographic projection of the second conducting layer 22b on the sampling board may cover the other n/2 resistors in the sampling board, and the potential of the second conducting layer 22b is less than ½ of the potential of the voltage input end. Here n is the quantity of resistors in the sampling board, and n is a multiple of 2. To be specific, a plurality of resistors connected in series in the sampling board are divided into two equal parts in sequence, the first conducting layer 22a is disposed at locations of n/2 resistors with higher voltages, and the second conducting layer 22b is disposed at locations of n/2 resistors with lower voltages.

For example, a first conducting layer 22a is disposed at locations of the resistors Ra(1) to Ra(n/2) in the sampling board 21a, a voltage at a location between the resistor Ra(n/4) and the resistor Ra(n/4+1) is led out to the first conducting layer 22a, and a voltage at a location between the resistor Ra(n/4) and the resistor Ra(n/4+1) is Va×¾. In this case, a voltage difference between the resistor Ra(1) and the first conducting layer 22a is Va/4, and a voltage difference between the resistor Ra(n/2) and the first conducting layer 22a is also Va/4. In this way, a distance a3 between the resistor Ra(1) and the first conducting layer 22a may be equal to a distance b3 between the resistor Ra(n/2) and the first conducting layer 22a. In addition, distances between the first conducting layer 22a and resistors between the resistor Ra(1) and the resistor Ra(n/2) may also be set to a3 (or b3). This can also meet a requirement on insulation between these resistors and the first conducting layer 22a.

A second conducting layer 22b is disposed at locations of the resistors Ra(n/2+1) to Ra(n) in the sampling board 21a, a voltage at a location between the resistor Ra(3n/4) and the resistor Ra(3n/4+1) is led out to the second conducting layer 22b, and a voltage at a location between the resistor Ra(3n/4) and the resistor Ra(3n/4+1) is Va/4. In this case, a voltage difference between the resistor Ra(n/2+1) and the second conducting layer 22b is Va/4, and a voltage difference between the resistor Ra(n) and the second conducting layer 22b is also Va/4. In this way, a distance a4 between the resistor Ra(n/2+1) and the second conducting layer 22b may be equal to a distance b4 between the resistor Ra(n) and the second conducting layer 22b. In addition, the distance a3 may be alternatively equal to the distance a4. In addition, the distances between the second conducting layer 22b and resistors between the resistor Ra(n/2+1) and the resistor Ra(n) may also be set to a4 (or b4). This can also meet a requirement on insulation between these resistors and the second conducting layer 22b.

Similarly, a first conducting layer 22a is disposed at locations of the resistors Rb(1) to Rb(n/2) in the sampling board 21b, a voltage at a location between the resistor Rb(n/4) and the resistor Rb(n/4+1) is led out to the first conducting layer 22a, and a voltage at a location between the resistor Rb(n/4) and the resistor Rb(n/4+1) is Vb×¾. In this case, a voltage difference between the resistor Rb(1) and the first conducting layer 22a is Vb/4, and a voltage difference between the resistor Rb(n/2) and the first conducting layer 22a is also Vb/4. In this way, a distance a5 between the resistor Rb(1) and the first conducting layer 22a may be equal to a distance b5 between the resistor Rb(n/2) and the first conducting layer 22a. In addition, the distances between the first conducting layer 22a and resistors between the resistor Rb(1) and the resistor Rb(n/2) may also be set to a5 (or b5). This can also meet a requirement on insulation between these resistors and the first conducting layer 22a.

A second conducting layer 22b is disposed at locations of the resistors Rb(n/2+1) to Rb(n) in the sampling board 21b, a voltage at a location between the resistor Rb(3n/4) and the resistor Rb(3n/4+1) is led out to the second conducting layer 22b, and a voltage at a location between the resistor Rb(3n/4) and the resistor Rb(3n/4+1) is Vb/4. In this case, a voltage difference between the resistor Rb(n/2+1) and the second conducting layer 22b is Vb/4, and a voltage difference between the resistor Rb(n) and the second conducting layer 22b is also Vb/4. In this way, a distance a6 between the resistor Rb(n/2+1) and the second conducting layer 22b may be equal to a distance b6 between the resistor Rb(n) and the second conducting layer 22b. In addition, the distance a5 may be alternatively equal to the distance a6. In addition, distances between the second conducting layer 22b and resistors between the resistor Rb(n/2+1) and the resistor Rb(n) may also be set to a6 (or b6). This can also meet a requirement on insulation between these resistors and the second conducting layer 22b.

In an example implementation, in the voltage sampler provided in some embodiments of this application, as shown in FIG. 8 and FIG. 10a, a bent portion T1 is disposed at an end that is of the first conducting layer 22a and that is close to the second conducting layer 22b, and the bent portion T1 is bent toward the housing 20. Alternatively, as shown in FIG. 8 and FIG. 10b, a bent portion T2 is disposed at an end that is of the second conducting layer 22b and that is close to the first conducting layer 22a, and the bent portion T2 is bent toward the housing 20. Alternatively, as shown in FIG. 8, FIG. 10a, and FIG. 10b, a bent portion T1 is disposed at an end that is of the first conducting layer 22a and that is close to the second conducting layer 22b, and the bent portion T1 is bent toward the housing 20; and a bent portion T2 is disposed at an end that is of the second conducting layer 22b and that is close to the first conducting layer 22a, and the bent portion T2 is bent toward the housing 20. In this way, an electric field at a location between the first conducting layer 22a and the second conducting layer 22b can be dispersed, to prevent an electric field generated by the first conducting layer 22a or the second conducting layer 22b from affecting electrical performance of the sampling board.

Based on a same technical concept, an embodiment of this application further provides a solid-state transformer. The solid-state transformer may include the voltage samplers according to any one of the foregoing implementations and a power converter electrically connected to the voltage sampler. In the voltage sampler, a conducting layer is disposed between a sampling board and a housing, and a potential of the conducting layer is between a potential of the housing and a potential of a voltage input end. This can reduce a voltage difference between the sampling board and a surrounding conductor, reduce a risk of damage to the sampling board due to excessive breakdown field strength, reduce a requirement on insulation between the sampling board and the surrounding conductor, and reduce a volume of the voltage sampler. The solid-state transformer includes the voltage samplers according to any one of the foregoing implementations. Because a volume of the voltage sampler is small, a volume of the solid-state transformer is also small.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A voltage sampler, comprising a conductive housing, at least one sampling board located inside the housing, and a conducting layer, wherein
each of the at least one sampling board comprises at least two resistors and a voltage input end, the at least two resistors are electrically connected in sequence in a direction from a first end to a second end, a resistor at the first end is electrically connected to the voltage input end, a resistor at the second end is electrically connected to the housing, the housing is electrically connected to a fixed potential end; and
the conducting layer is disposed between at least one of the at least one sampling board and the housing, the conducting layer is electrically connected to one of the at least two resistors in the sampling board.

2. The voltage sampler according to claim 1, further comprising an insulator located inside the housing, wherein at least one cavity configured to accommodate the at least one sampling board is disposed in the insulator, and there is a gap between each of the at least one sampling board and the insulator.

3. The voltage sampler according to claim 2, wherein one sampling board is disposed in each of the at least one cavity.

4. The voltage sampler according to claim 3, wherein at least two cavities connected to each other are disposed in the insulator.

5. The voltage sampler according to claim 2, wherein the conducting layer is disposed on an inner wall of the cavity, and an insulation film is disposed on a surface on a side that is of the conducting layer and that faces the sampling board.

6. The voltage sampler according to claim 2, wherein the conducting layer is embedded inside the insulator.

7. The voltage sampler according to claim 2, wherein the insulator comprises a first insulation portion and a second insulation portion fixedly connected to the first insulation portion;
the first insulation portion comprises a groove configured to accommodate the sampling board; and
the groove in the first insulation portion and the second insulation portion form the at least one cavity.

8. The voltage sampler according to claim 3, wherein the insulator comprises a first insulation portion and a second insulation portion fixedly connected to the first insulation portion;
the first insulation portion comprises a groove configured to accommodate the sampling board; and
the groove in the first insulation portion and the second insulation portion form the at least one cavity.

9. The voltage sampler according to claim 4, wherein the insulator comprises a first insulation portion and a second insulation portion fixedly connected to the first insulation portion;
the first insulation portion comprises a groove configured to accommodate the sampling board; and
the groove in the first insulation portion and the second insulation portion form the at least one cavity.

10. The voltage sampler according to claim 5, wherein the insulator comprises a first insulation portion and a second insulation portion fixedly connected to the first insulation portion;
the first insulation portion comprises a groove configured to accommodate the sampling board; and
the groove in the first insulation portion and the second insulation portion form the at least one cavity.

11. The voltage sampler according to claim 7, wherein a strip-shaped groove is disposed at the top of a side wall of the groove in the first insulation portion, a strip-shaped protrusion corresponding to a location of the strip-shaped groove is disposed in the second insulation portion, and the strip-shaped protrusion is embedded in the corresponding strip-shaped groove.

12. The voltage sampler according to claim 7, wherein a strip-shaped protrusion is disposed at the top of a side wall of the groove in the first insulation portion, a strip-shaped groove corresponding to a location of the strip-shaped protrusion is disposed in the second insulation portion, and the strip-shaped protrusion is embedded in the corresponding strip-shaped groove.

13. The voltage sampler according to claim 7, wherein the conducting layer is disposed on an inner bottom surface and an inner side surface of the groove in the first insulation portion.

14. The voltage sampler according to claim 1, wherein one conducting layer is disposed between at least one of the at least one sampling board and the housing; and an orthographic projection of the conducting layer on the at least one sampling board covers at least half of the at least two resistors in the sampling board, the orthographic projection of the conducting layer on the sampling board covers the resistor located at the first end, and the potential of the conducting layer is greater than ½ of the potential of the voltage input end.

15. The voltage sampler according to claim 14, wherein the orthographic projection of the conducting layer on the sampling board covers 2n/3 resistors, and the potential of the conducting layer is equal to ⅔ of the potential of the voltage input end, wherein n is a quantity of resistors in the sampling board, and n is a multiple of 3.

16. The voltage sampler according to claim 1, wherein two conducting layers are disposed between at least one of the at least one sampling board and the housing: a first conducting layer and a second conducting layer;

an orthographic projection of the first conducting layer on the sampling board covers some of the at least two resistors in the sampling board, an orthographic projection of the second conducting layer on the sampling board covers the other resistors in the sampling board, and the orthographic projection of the first conducting layer on the sampling board covers the resistor at the first end; and a potential of the first conducting layer is greater than that of the second conducting layer.

17. The voltage sampler according to claim 16, wherein the orthographic projection of the first conducting layer on the at least one sampling board covers n/2 resistors in the sampling board, and the orthographic projection of the second conducting layer on the at least one sampling board covers the other n/2 resistors in the sampling board; and the potential of the first conducting layer is greater than ½ of the potential of the voltage input end, and the potential of the second conducting layer is less than ½ of the potential of the voltage input end, wherein n is a quantity of resistors in the at least one sampling board, and n is a multiple of 2.

18. The voltage sampler according to claim 16, wherein a bent portion is disposed at an end that is of the first conducting layer and that is close to the second conducting layer, and the bent portion is bent toward the housing.

19. The voltage sampler according to claim 16, wherein a bent portion is disposed at an end that is of the second conducting layer and that is close to the first conducting layer, and the bent portion is bent toward the housing.

20. A solid-state transformer, comprising a voltage sampler, and a power converter electrically connected to the voltage sampler; wherein the voltage sampler comprises a conductive housing, at least one sampling board located inside the housing, and a conducting layer, wherein each of the at least one sampling board comprises at least two resistors and a voltage input end, the at least two resistors are electrically connected in sequence in a direction from a first end to a second end, a resistor at the first end is electrically connected to the voltage input end, a resistor at the second end is electrically connected to the housing, the housing is electrically connected to a fixed potential end; and the conducting layer is disposed between at least one of the at least one sampling board and the housing, the conducting layer is electrically connected to one of the at least two resistors in the sampling board.

* * * * *